(12) United States Patent
Kizilyalli et al.

(10) Patent No.: US 6,383,879 B1
(45) Date of Patent: May 7, 2002

(54) SEMICONDUCTOR DEVICE HAVING A METAL GATE WITH A WORK FUNCTION COMPATIBLE WITH A SEMICONDUCTOR DEVICE

(75) Inventors: Isik C. Kizilyalli, Millburn, NJ (US); Ranbir Singh, Orlando, FL (US); Lori Stirling, Princeton, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/572,060

(22) Filed: May 17, 2000

Related U.S. Application Data
(60) Provisional application No. 60/168,911, filed on Dec. 3, 1999.

(51) Int. Cl.⁷ .............................................. H01L 21/336
(52) U.S. Cl. ...................................... 438/303; 438/592
(58) Field of Search ........................... 438/199, 230, 438/302, 303, 584, 586, 592, 682, 683, 902, 163, 585, 595, 669

(56) References Cited

U.S. PATENT DOCUMENTS

| | | |
|---|---|---|
| 5,245,207 A | 9/1993 | Mikoshiba et al. |
| 5,559,368 A | 9/1996 | Hu et al. |
| 5,773,347 A * | 6/1998 | Kimura et al. ............... 438/302 |
| 6,017,809 A * | 1/2000 | Inumiya et al. ............. 438/585 |
| 6,027,961 A * | 2/2000 | Maiti et al. .................. 438/199 |
| 6,051,865 A | 4/2000 | Gardner et al. |
| 6,083,836 A | 7/2000 | Rodder |
| 6,130,123 A | 10/2000 | Liang et al. |

FOREIGN PATENT DOCUMENTS

| | | |
|---|---|---|
| EP | 0 915 510 A1 | 5/1999 |
| EP | 1 005 094 A2 | 5/2000 |
| EP | 1 032 033 A2 | 8/2000 |
| GB | 2 347 789 A | 9/2000 |

OTHER PUBLICATIONS

M. Buchanan; "Scaling the Gate Dielectric: Materials, Integration and Reliability"; Journal of Resarch & Development, vol. 43,No. 3 IBM 1999; pp. 1–20.

B. Maiti and P.J. Tobin; "Metal Gates for Advanced CMOS Technology"; Part of the SPIE Conference on Microelectronic Device Technology III, Santa Clara, California 1999, SPIE vol. 3881; pp. 46–57.

* cited by examiner

Primary Examiner—David Nelms
Assistant Examiner—Phuc T. Dang

(57) ABSTRACT

The present invention provides a semiconductor device located on a semiconductor substrate having opposite types of first and second transistors formed thereon. The device preferably includes a first gate electrode that includes a first metal gate electrode material having a work function compatible with the first transistor, and a second gate electrode that includes a second metal gate electrode material having a work function compatible with the second transistor and the first metal gate electrode material is also located over the second metal gate electrode material, which forms a gate stack.

14 Claims, 4 Drawing Sheets

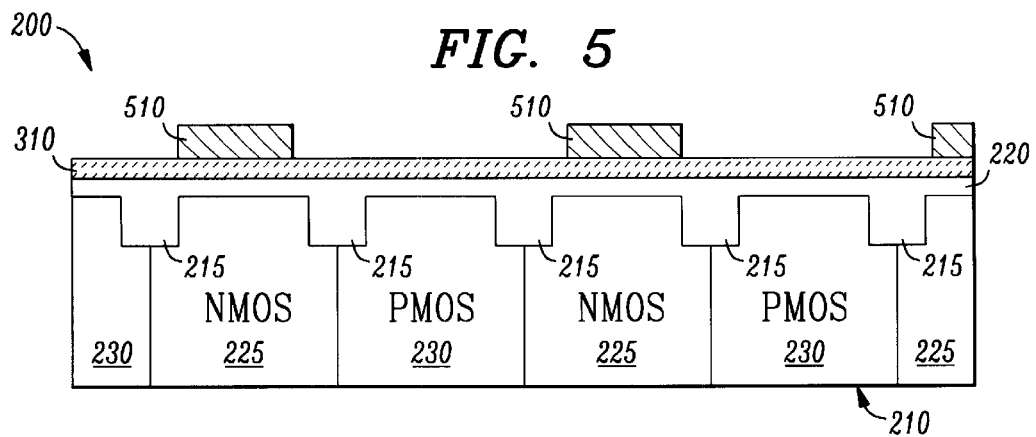
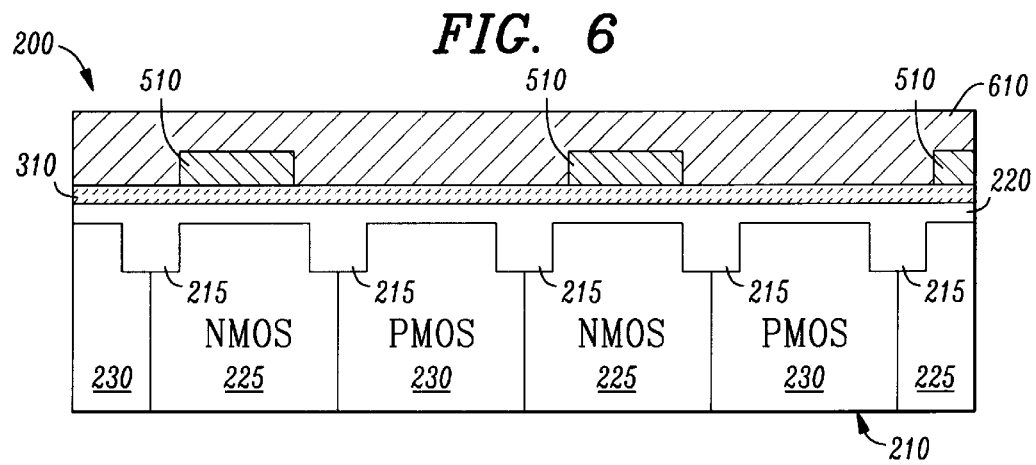
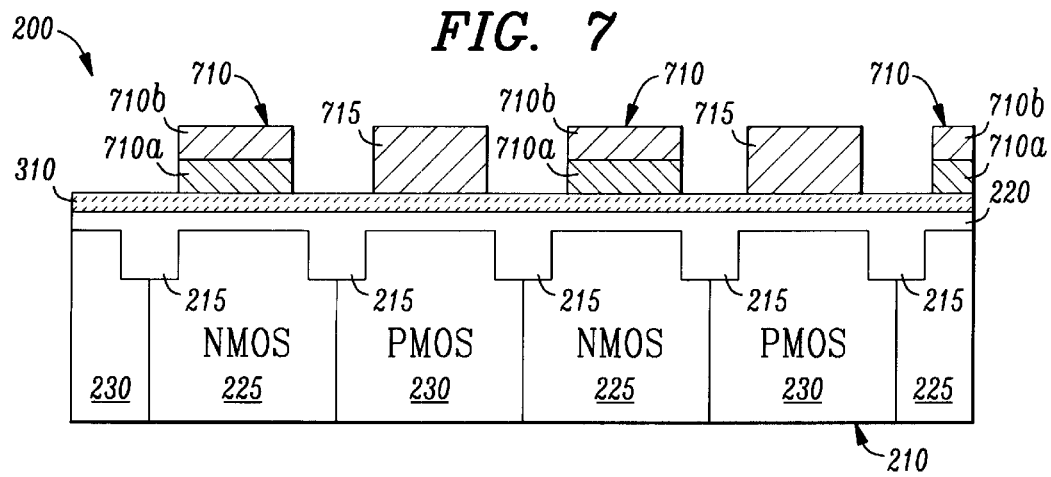

SEMICONDUCTOR DEVICE HAVING A METAL GATE WITH A WORK FUNCTION COMPATIBLE WITH A SEMICONDUCTOR DEVICE

CROSS-REFERENCE TO PROVISIONAL APPLICATION

This application claims the benefit of U.S. Provisional Application No. 60/168,911 entitled "CMOS WITH METAL GATES BY WORK FUNCTION ENGINEERING," to Isik Kizilyalli, et. al., filed on Dec. 3, 1999, which is commonly assigned with the present invention and incorporated herein by reference as if reproduced herein in its entirety.

TECHNICAL FIELD OF THE INVENTION

The present invention is directed, in general, to a semiconductor device.

BACKGROUND OF THE INVENTION

Semiconductor devices are continually improved to enhance device performance. For example, both smaller device size and higher speed of operation are highly desirable performance targets. Transistors also have been continually reduced in size as the ability to construct smaller gate structures for complementary metal oxide silicon (CMOS) transistors has improved. With the smaller gate structures, the gate dielectric thickness has also substantially decreased to 3 nm and below in today's current technologies. Polysilicon is one material used to form these gate structures. However, the use of polysilicon gates, particularly in smaller CMOS devices, has caused several problems. A significant disadvantage is the polysilicon depletion effect. The polysilicon depletion effect occurs because polysilicon does not have an infinite amount of carriers. Presently, polysilicon can only be doped to a range of about $2E20/cm^3$ to about $3E20/cm^3$. As such, an infinite amount of carriers (for all intents and purposes larger than about $5E21/cm^3$) are not present in the gate material, and when the gate is biased, a depletion region near the polysilicon gate/gate dielectric interface is generated due to the lack of these carriers.

If the polysilicon gate is not implanted to a high enough concentration, or if the implanted dopant is not sufficiently activated, a significant voltage is dropped across the gate. When the active carrier concentration in the polysilicon is not high enough so that the Fermi level at the polysilicon/gate dielectric interface, such as silicon dioxide, the band bending in the poly silicon becomes voltage-dependent. As the device is biased such that the silicon substrate is inverted and a channel is formed, the polysilicon gate becomes depleted of free carriers. As the polysilicon is driven into depletion, part of the applied voltage is dropped across the gate, reducing the field at the $Si/SiO_2$ interface and decreasing the channel carrier concentration. As a result, the drive current is reduced, thereby reducing the device's switching speed as well.

As the gate dielectric has scaled to below 3 nm, effects attributable to polysilicon depletion, as discussed above, are even more acute. The polysilicon depletion effect makes the gate dielectric to appear electrically thicker than it actually is. For example, the polysilicon depletion effect causes the gate oxide to electrically function as if it were from about 0.5 nm to about 1.5 nm thicker than the actual gate oxide thickness. When the gate dielectric is on the order of 15 nm thick, 0.5 nm of additional thickness due to the silicon depletion effect is not significant. However, when the gate dielectric thickness is about 5 nm and below, an additional operational thickness of 0.5 nm due to the polysilicon depletion effect can have a significant impact on the device's operation and performance as discussed above. Additionally, another difficulty is that with the scaling of devices, thermal treatments are also limited (i.e., thermal budgets are reduced). Therefore, the polysilicon may be doped heavily, e.g., $2-3E20/cm^3$, but the dopants are difficult to electrically activate due to these reduced thermal budgets.

Since polysilicon material cannot be doped or dopants activated at levels higher than about $2-3E20/cm$, scaling the gate length produces a gate resistance. Therefore, a higher than desirable electrical sheet resistance or resistivity for polysilicon arises and produces unacceptable large time delays in the circuits due to the RC time constant formed.

Another problem encountered with polysilicon gate is lateral diffusion. Often, gate dopants diffuse laterally into a neighboring counter-doped gate, which can cause the gate to malfunction.

The use of p-type polysilicon gates was first introduced to reduce short-channel effects and lower threshold voltage as the devices were pushed into the submicron regime. However, with the use of boron as the dopant for the p-type polysilicon gates, dopant diffusion and its subsequent penetration into the gate dielectric have become a problem. The penetration of the boron into the gate dielectric causes a number of problems not only with the quality of the dielectric but also with the device operation. Boron penetration shifts the threshold voltage of the metal oxide semiconductor (MOS) devices to more positive values. Degradation of the metal oxide semiconductor field effect transistor (MOSFET) transconductance and the subthreshold slope is also correlated with boron penetration.

Accordingly, what is needed in the art is a semiconductor device that has gate structures that address the problems discussed above.

SUMMARY OF THE INVENTION

To address the above-discussed deficiencies of the prior art, the present invention provides a semiconductor device disposed over a semiconductor substrate having opposite types of first and second transistors formed thereon. In an exemplary embodiment, the device includes a first gate electrode that includes a first gate electrode material having a work function compatible with the first transistor, and a second gate electrode that includes a second gate electrode material having a work function compatible with the second transistor and the first gate electrode material, which forms a gate stack.

BRIEF DESCRIPTION OF THE DRAWINGS

The invention is best understood from the following detailed description when read with the accompanying drawing figures. It is emphasized that in accordance with the standard practice in the semiconductor industry the various features are not drawn to scale. In fact, the dimensions of the various features may be arbitrarily increased reduced for clarity of discussion.

FIG. 5 illustrates the semiconductor wafer shown in FIG. 4 after patterning of the first gate electrode material over the metal etch barrier layer;

FIG. 6 illustrates the partial cross section of the semiconductor wafer shown in FIG. 5 following the deposition of another gate electrode material; and FIG. 7 illustrates the partial cross section of the semiconductor wafer shown in FIG. 6 following the patterning of another gate electrode material;

DETAILED DESCRIPTION

Figure 1:
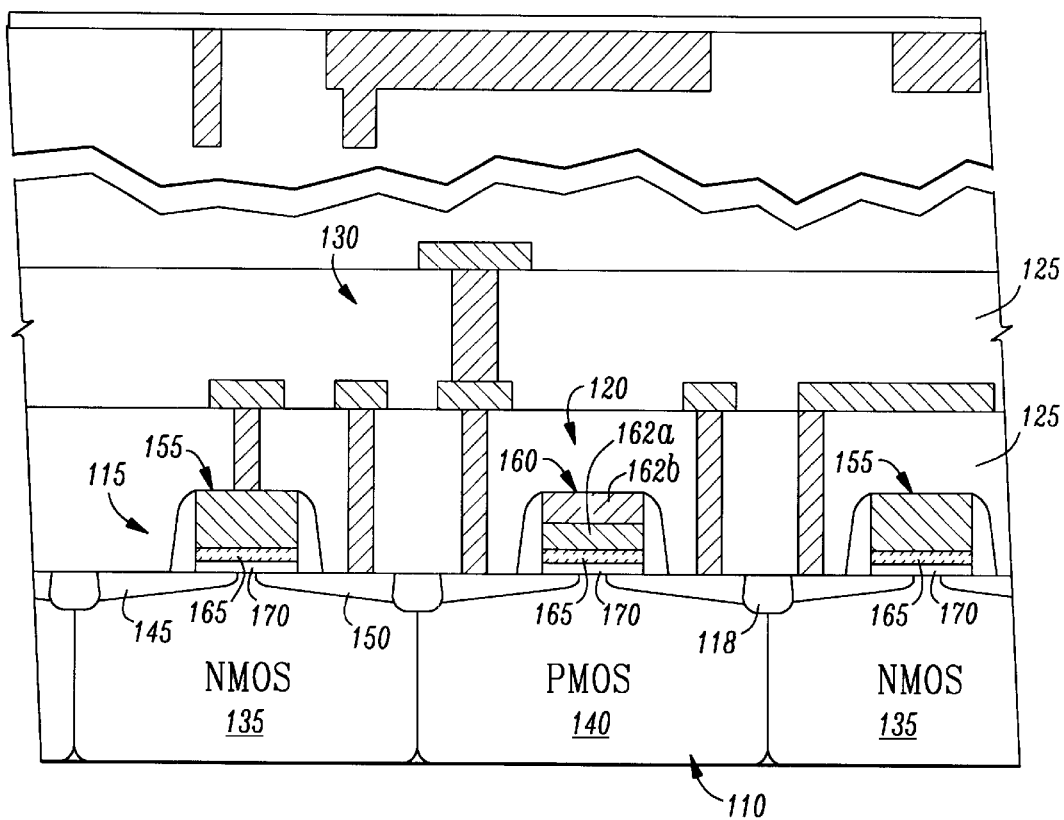
FIG. 1 illustrates a partial cross section of an integrated circuit incorporating a gate structure as covered by one embodiment of the present invention.

Referring initially to FIG. 1, there is illustrated a partial cross section of an exemplary integrated circuit 100 incorporating the gate structure as covered by the present invention. The integrated circuit 100 may be a CMOS device, a BiCMOS device, a field effect transistor generally or another type of integrated circuit. Also shown in FIG. 1 are conventional components of the integrated circuit device 100, including: transistors 115, 120 located between oxide isolation structures 118, dielectric layers 125 in which interconnect structures 130 are formed (together forming interconnect layers). The interconnect structures 130 connect the transistors 115, 120 to other areas of the integrated circuit 100 (not shown). Also included in the integrated circuit 100 are NMOS tubs, 135 and PMOS tubs 140, source regions 145 and drain regions 150. The transistors 115, 120 also include gate structures 155, 160, respectively, as covered by the present invention. The gate structures 155, 160, which are described in more detail below, are located over a barrier layer 165 and a gate dielectric layer 170. As illustrated, the gate structure 160 has different gate layers 162a, 162b.

The gate electrode material may be selected such that it has a work function that is compatible with the transistor device in which it will operate. That is, if the transistor device is to be an NMOS transistor, then the gate electrode material preferably has a work function that is substantially equal to an $n^+$ doped polysilicon, which, in a preferred embodiment, is about 4.2 eV. Some examples of such materials include tantalum, tungsten, titanium, titanium nitride, tantalum nitride or an n-type doped polysilicon. If it were possible to infinitely dope the polysilicon gate electrode, the depletion region gets significantly smaller. Fortunately, metal gates have practically an infinite (e.g., $5E22/cm^3$) amount of carriers as compared to conventional polysilicon gate structures. Thus, the silicon depletion can be significantly reduced by using metal gates.

On the other hand, if the transistor device is to be a PMOS transistor, then the gate electrode material preferably has a work function that is substantially equal to a $p^+$ doped polysilicon, which, in an illustrative embodiment, can range from about 5.2 eV to about 5.3 eV. An example of such material is tungsten silicide, which is particularly advantageous because it has an effective work function that is very similar to that of a $p^+$ doped polysilicon. In the embodiments illustrated below, the gates are patterned to be located over the NMOS device. Thus, in this particular example, a gate electrode material having a work function substantially equal to $n^+$ polysilicon should be used.

Figure 2:
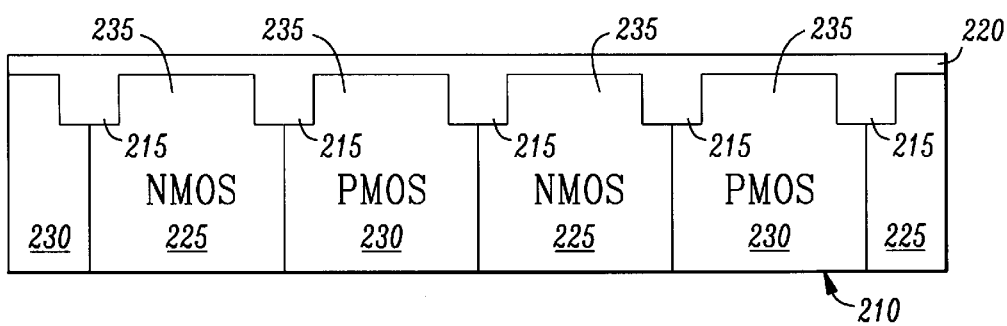
FIG. 2 illustrates a partial cross-section of a semiconductor wafer as covered by the present invention will ultimately be formed.

Turning now to FIG. 2, there is illustrated a partial cross section of a semiconductor wafer 200 having a substrate 210, such as an epitaxial layer, deposited thereon and on which a semiconductor device as covered by the present invention will ultimately be formed. In the illustrated embodiment, the semiconductor wafer 200 includes shallow trench field oxide regions 215 having a preferred depth of about 300 nm and a gate dielectric layer 220. The gate dielectric layer 220, such as a silicon dioxide layer, is conventionally formed and may be of any thickness. However in today's technologies, the gate dielectric layer 220 preferably has a thickness that is about 3 nm or less. The gate dielectric layer 220 is located over alternating n-channel metal oxide semiconductor (NMOS) tubs 225 and p-channel metal oxide semiconductor (PMOS) tubs 230 that have been formed in the substrate 210. Those who are skilled in the art realize that source/drains (not shown) will also be included in the completed semiconductor device, which will form channel region 235 between the field oxide regions 215. Those who are skilled in the art also realize how to dope the NMOS and PMOS regions 225, 230 and the source/drain regions to achieve the desired channel type when the semiconductor device is operated.

Figure 3:
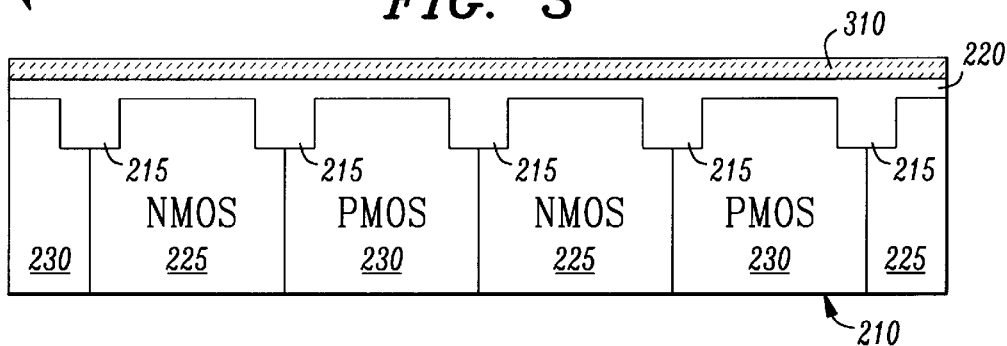
FIG. 3 illustrates the semiconductor wafer of FIG. 100 following the deposition of a metal etch barrier layer.

Turning now to FIG. 3, there is illustrated the semiconductor wafer 200 of FIG. 2 following the deposition of a metal etch barrier layer 310. The barrier layer 310 serves as an metal etch stop for subsequent metal etching process used to form gate structures as discussed below. The metal etch barrier layer 310 is preferably a material having a high dielectric constant (K). For example, the metal etch barrier layer 310 may be tantalum pentoxide, silicon nitride or an aluminum oxide. The metal etch barrier layer 310 may be deposited using conventional processes and may be deposited to a thickness of about 3 nm, if so desired. Because of the high K, the metal etch barrier layer 310 does not significantly change the electrical operation of the semiconductor device and only effectively adds a small amount of thickness in addition to the device's gate dielectric.

Figure 4:
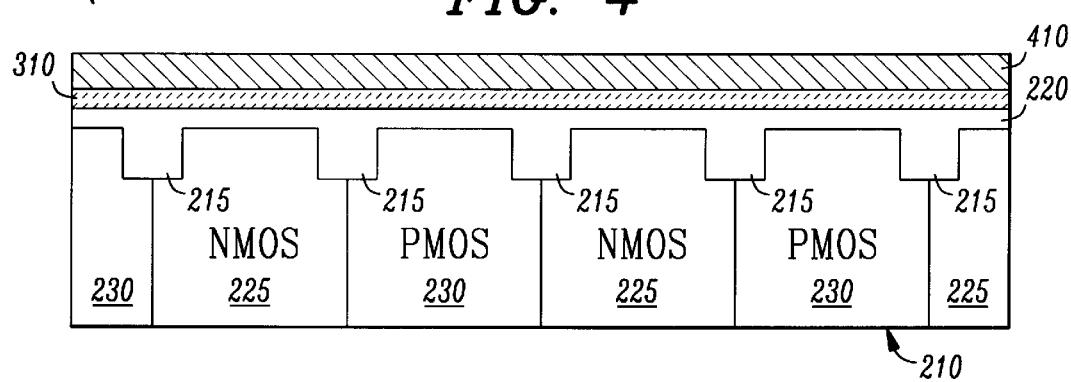
FIG. 4 illustrates the semiconductor wafer shown in FIG. 3 after a blanket deposition of a first gate electrode material over the metal etch barrier layer.

Turning now to FIGS. 4 and 5, there is illustrated the semiconductor wafer 200 shown in FIG. 3 after a blanket deposition of a first gate electrode material 410 over the metal etch barrier layer 310. The first gate electrode material 410 may be deposited to a thickness ranging from about 10 nm to about 40 nm. As shown in FIG. 5, the gate electrode material 410 is patterned using conventional photolithographic process to form a gate structure 510 over the desired NMOS or PMOS region. The gate electrode material 410 is selected such that it has a work function that is compatible with the transistor device in which it will operate. That is, if the transistor device is to be an NMOS transistor, then the gate electrode material 410 preferably has a work function that is substantially equal to an $n^+$ doped polysilicon, which, in a preferred embodiment, is about 4.2 eV. Some examples of such materials include tantalum, tungsten, titanium, titanium nitride, tantalum nitride or an n-type doped polysilicon. If it were possible to infinitely dope the polysilicon gate electrode, the depletion region gets significantly smaller. Fortunately, metal gates have practically an infinite (e.g., 5E22/cm³) amount of carriers as compared to conventional polysilicon gate structures. Thus, the silicon depletion can be significantly reduced by using metal gates.

On the other hand, if the transistor device is to be a PMOS transistor, then the gate electrode material 410 preferably has a work function that is substantially equal to a p⁺ doped polysilicon, which, in an illustrative embodiment, can range from about 5.2 eV to about 5.3 eV. An example of such material is tungsten silicide, which is particularly advantageous because it has an effective work function that is very similar to that of a p⁺ doped polysilicon. In the illustrated embodiment, the gates 510 are patterned to be located over the NMOS device 225. Thus, in this particular example, a gate electrode material having a work function substantially equal to n⁺ polysilicon should be used.

Turning now to FIGS. 6 and 7, there is illustrated a partial cross section of the semiconductor wafer 200 shown in FIG. 5 following the deposition of another gate electrode material 610. Preferably, this gate electrode material 610 is deposited to a thickness ranging from about 40 nm to about 400 nm before patterning. The gate electrode material 610 is chosen to have a work function that is substantially equal to the work function of the device that is opposite the device on which the gates 510 are formed. For example, in the illustrated embodiment, the work function of the gate 510 is compatible with an NMOS device, and thus, the work function of the gate electrode material 610 is chosen to be compatible with a PMOS device. The gate electrode material 610 is patterned with conventional photolithographic processes to form stacked gate electrodes 710 having different gate layers 710a and 710b over one device and non-stacked gate electrode 715 over another device. In the illustrated embodiment, the gate electrode layer 710a is preferably tantalum, tungsten, titanium, titanium nitride, tantalum nitride or n⁺ polysilicon, while a preferred material for gate 715 is tungsten silicide.

Figure 8:
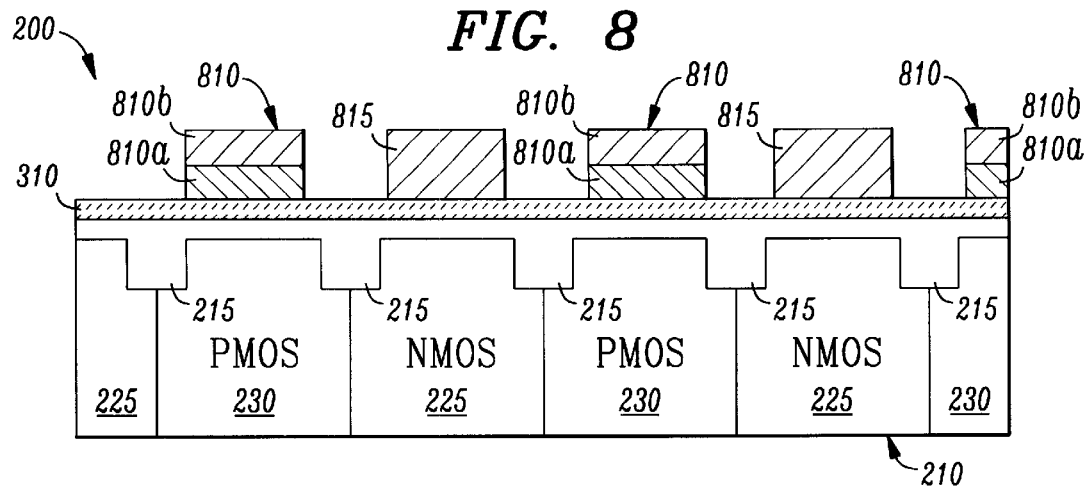
FIG. 8 illustrates a partial cross section of an illustrative embodiment where stacked gate electrodes comprising different gate electrode layers are formed over the PMOS regions and a non-stacked gate is formed over NMOS regions 125.

The integration scheme just discussed above may be altered to arrive at the device illustrated in FIG. 8. FIG. 8 shows an illustrative embodiment where stacked gates 810 comprising gate layers 810a and 810b are formed over the PMOS regions 230 and non-stacked gates 815 are formed over NMOS regions 225. In this particular embodiment, an exemplary material comprising layer 810a may be tungsten silicide, while exemplary materials comprising layer 810b and gate 815 may be tantalum, tungsten, titanium, titanium nitride, tantalum nitride or an n⁺ polysilicon.

Figure 9:
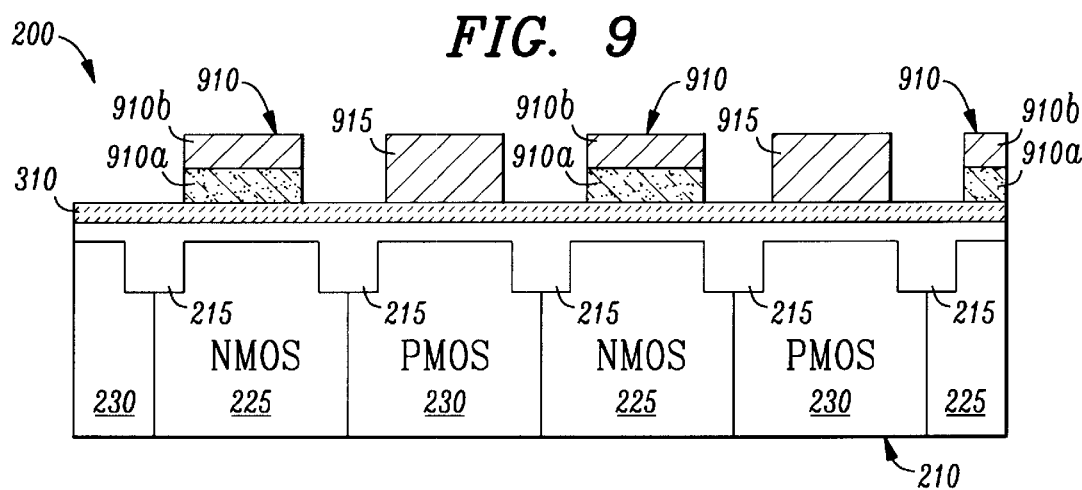
FIG. 9 illustrates a partial cross section of an illustrative embodiment wherein $n^+$ polysilicon is used as the lower gate electrode material in an NMOS device.

In an illustrative embodiment shown in FIG. 9, n⁺ polysilicon can be used to form a stacked gate 910 having a doped polysilicon layer 910a and a tungsten silicide layer 910b the NMOS device, while gates 915 formed over the PMOS device comprise tungsten silicide.

In those embodiments where the gates include a doped polysilicon layer, it should be noted that the polysilicon layer may be doped by diffusion of a dopant from the over lying tungsten silicide metal layer. For example, when forming an n⁺ polysilicon, phosphorous or arsenic may be implanted into the tungsten silicide prior to patterning the gates at a concentration level of ranging from about $0.1 \times 10^{16}$/cm² to about $1 \times 10^{16}$/cm², 5–50 KeV and diffused with a rapid thermal anneal or furnace. This can be done without affecting the work function of the metal silicide because a metal's work function is not altered by diffusing dopant into the metal. Thus, additional masking steps typically required to introduce dopants into polysilicon can be avoided.

Figure 10:
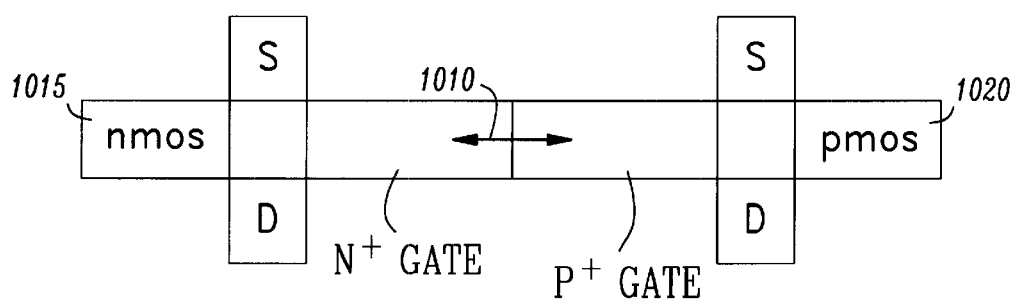
FIG. 10 illustrates a schematic overhead view of adjoining gate electrode materials in which boron diffusion may occur.

Another advantage provided by the present invention is that the novel gate structures inhibits lateral boron diffusion, indicated by the arrow 1010 in adjoining but opposite or countered-doped gate structures 1015, 1020, as shown in FIG. 10. Boron diffusion occurs during thermal after implantation of boron into polysilicon in PMOS gate structures.

The boron laterally diffuses into adjoining NMOS gate structures, which can cause the NMOS devices to malfunction. Boron penetration through the gate dielectric is also inhibited because a metal, such as tungsten silicide, can be used in place of a boron doped polysilicon.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device located on a semiconductor substrate having opposite types of first and second transistors formed thereon, comprising;
    forming a metal etch barrier layer
        forming a first gate electrode of a first metal gate electrode material having a work function compatible with the first transistor over the metal etch barrier layer; and
        forming a second gate electrode of a second metal gate electrode material having a work function compatible with the second transistor over the metal etch barrier layer.

2. The method as recited in claim 1 wherein forming a first metal gate electrode material includes forming a metal gate electrode.

3. The method as recited in claim 1 wherein forming a second metal gate electrode material includes forming a metal gate electrode.

4. The method as recited in claim 1 wherein forming a first gate electrode includes forming a gate electrode including a doped polysilicon doped with an n-type dopant.

5. The method as recited in claim 1 forming a second gate electrode includes forming a gate electrode including a metal silicide.

6. The method as recited in claim 5 wherein forming a gate electrode including metal silicide includes forming a gate electrode including tungsten silicide.

7. The method as recited in claim 1, wherein forming a metal etch barrier layer includes forming a metal etch barrier layer having a high dielectric constant.

8. The method as recited in claim 7 wherein forming a metal etch barrier layer includes forming a metal etch barrier layer including tantalum pentoxide, silicon nitride or aluminum oxide.

9. The method as recited in claim 1 further including forming a gate dielectric prior to forming the first and second gate electrodes.

10. The method as recited in claim 9 wherein forming a gate dielectric includes forming a gate silicon dioxide to a thickness of about 2 nm or less.

11. The method as recited in claim 1 wherein forming a first metal gate electrode material includes forming a metal gate electrode material including tantalum, tungsten, titanium, titanium nitride, or tantalum nitride.

12. The method as recited in claim 1 wherein forming the first gate electrode includes forming a portion of an NMOS device and forming the second gate electrode includes forming a portion of a PMOS device.

13. The method as recited in claim 1 wherein forming the first gate electrode includes forming a portion of a PMOS device and forming the second gate electrode includes forming a portion of an NMOS device.

14. The method as recited in claim 1 wherein forming a first gate electrode includes forming a gate electrode with a material having a work function of about 4.2 eV and forming a second gate electrode includes forming a gate electrode with a material having a work function of about 5.2 eV.

* * * * *